(12) United States Patent
Welstand

(10) Patent No.: US 6,770,554 B1
(45) Date of Patent: Aug. 3, 2004

(54) ON-CHIP INTERCONNECT CIRCUITS WITH USE OF LARGE-SIZED COPPER FILL IN CMP PROCESS

(75) Inventor: Robert Bernard Welstand, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/402,692

(22) Filed: Mar. 27, 2003

(51) Int. Cl.$^7$ ........................................... H01L 21/4763
(52) U.S. Cl. ..................... 438/618; 438/622; 438/637; 438/638; 438/687
(58) Field of Search ............................... 438/637, 638, 438/687

(56) References Cited

U.S. PATENT DOCUMENTS

| | | | | |
|---|---|---|---|---|
| 6,143,640 A | * | 11/2000 | Cronin et al. ............... | 438/637 |
| 6,498,385 B1 | * | 12/2002 | Daubenspeck et al. ..... | 257/529 |
| 6,499,135 B1 | * | 12/2002 | Li et al. ........................ | 716/19 |
| 6,608,335 B2 | * | 8/2003 | Dixit et al. .................. | 257/211 |
| 6,680,520 B2 | * | 1/2004 | Voldman et al. ............ | 257/532 |
| 6,686,643 B2 | * | 2/2004 | Schwarzl et al. ........... | 257/522 |
| 2002/0185664 A1 | * | 12/2002 | Dixit et al. .................. | 257/211 |
| 2003/0113974 A1 | * | 6/2003 | Ning et al. .................. | 438/379 |

* cited by examiner

*Primary Examiner*—Lynne Gurley
(74) *Attorney, Agent, or Firm*—Incaplaw; Terrance A. Meador

(57) ABSTRACT

The invention is a design method to lower the capacitance in high-frequency interconnect circuits built using copper dual-damascene back-end-of-line (BEOL). The method achieves lower interconnect capacitance by reducing capacitance to parasitic copper fill shapes. Parasitic capacitance is reduced physically by a) stacking copper fill shapes on each copper layer, and b) using larger dimension fill shapes. The consequence of using larger dimension fill shapes is to: a) increase white space between fill shapes, and b) reduce the summed perimeter of the fill shapes.

12 Claims, 2 Drawing Sheets

FIG. 1
Parallel

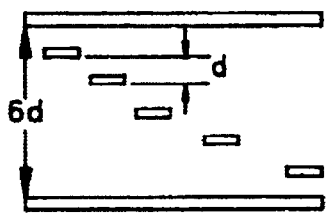

Equivalent Circuit

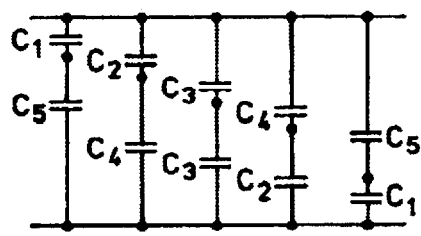

$C_1 = \frac{EA}{d}; \quad C_2 = \frac{EA}{2d}; \quad C_3 = \frac{EA}{3d};$ $C_4 = \frac{EA}{4d}; \quad C_5 = \frac{EA}{5d}$ $C_{TOT} = 2(C_1 \| C_5) + 2(C_2 \| C_4) + (C_3 \| C_3)$ $C_{TOT} = 2\left(\frac{C_1 \cdot C_5}{C_1 + C_5} + \frac{C_2 \cdot C_4}{C_2 + C_4}\right) + \frac{1}{2}C_3$ $C_{TOT} = 2\left(\frac{C_1 \cdot C_{1/5}}{C_1 \cdot (1/5)} + \frac{C_{1/2} \cdot C_{1/4}}{C_1(1/2 + 1/4)}\right) + \frac{1}{2} \cdot \frac{1}{3}C_1$ $C_{TOT} = \frac{1}{6}C_1 + 2C_1(1/6 + 1/6)$ $\boxed{C_{TOT} = \frac{5}{6}C_1}$

FIG. 2
Series

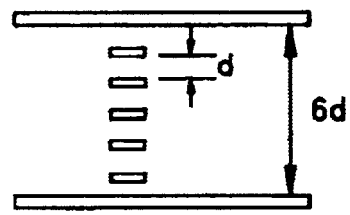

Equivalent Circuit

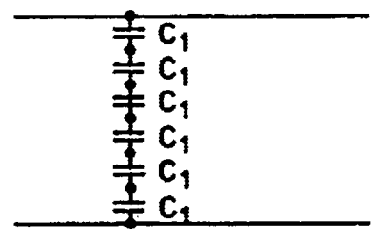

$\boxed{C_{TOT} = \frac{1}{6}C_1}$

US 6,770,554 B1

ON-CHIP INTERCONNECT CIRCUITS WITH USE OF LARGE-SIZED COPPER FILL IN CMP PROCESS

FIELD OF THE INVENTION

The present invention relates generally to electronic integrated circuit wiring techniques. More particularly, the present invention relates to on-chip interconnect circuits with use of large-sized copper fill in CMP processing.

BACKGROUND OF THE INVENTION

In the -chemical mechanical polishing (CMP) process of dual damascene copper back-end-of-line (BEOL), minimum copper densities must be present over the local areas of the wafer to maintain planarity during polishing. Correct copper densities are achieved in low-density areas by adding dummy copper shapes in the circuit design; these dummy shapes are known as fill. Process engineers have identified that fill shapes larger than the minimum linewidth improve manufacturing yield. However, little attention has been paid to the fill impact on electrical performance of interconnect circuits, other than a relatively larger effective capacitance of the dielectric stack. At high frequencies, the AC coupling between the interconnect signals and fill shapes can be significant and excessive capacitance can reduce circuit performance.

High frequency interconnect circuits consist of a signal line and an appropriate ground reference nearby. Such ground reference can be either a DC ground or an AC ground with a static reference potential other than 0 Volts. Characteristic impedance for interconnect circuits is accomplished by design of signal line width and separation to the reference ground conductors. The regions of white space (absence of metal) between the signal and ground or adjacent to a signal line without ground is therefore critical in control of the characteristic impedance and capacitance per unit length of the interconnect.

Sub-micron fill shapes at 10–50% area densities effectively increase the strength of electric fields in a pejorative way for copper interconnect circuits. The larger capacitance can be compensated in the design of the interconnect by proportionately increasing the inductance. However, this may either increase the conductor resistance or reduce the signal routing density, both of which are undesirable.

Accordingly, a need exists to lower the capacitance in high-frequency interconnect circuits that utilize copper fill shapes.

BRIEF SUMMARY OF THE INVENTION

The invention is a design method to lower the capacitance in high-frequency interconnect circuits built using copper dual-damascene back-end-of-line (BEOL). The method achieves lower interconnect capacitance by reducing capacitance to parasitic copper fill shapes. Parasitic capacitance is reduced physically by a) stacking copper fill shapes on each copper layer, and b) using larger dimension fill shapes. The consequence of using larger dimension fill shapes is to: a) increase white space between fill shapes, and b) reduce the summed perimeter of the fill shapes.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 1 shows capacitances in parallel and equivalent circuit comparison and calculations;

FIG. 2 shows capacitances in series and equivalent circuit comparison and calculations;

DETAILED DESCRIPTION OF A PREFERRED EMBODIMENT

The particular implementations shown and described herein are illustrative of the invention and its best mode and are not intended to otherwise limit the scope of the invention in any way. Indeed, for the sake of brevity, conventional techniques related to electronic device manufacturing, waveguide design, flip-chip design, solder bump composition, deposition, and reflow, and other aspects of the interconnect structures may not be described in detail herein.

The invention provides a low-capacitance copper fill approach in the areas of critical high speed interconnect circuits, while maintaining minimum copper density rules for high-yield manufacturability. The advantage of this invention over the prior art is that impedance-controlled interconnects can be designed with reduced capacitance per unit length and minimal lateral crosstalk. The method avoids increased parasitic capacitance in critical high-frequency design areas.

The invention is a design method to lower the capacitance in high-frequency interconnect circuits built using copper dual-damascene back-end-of-line (BEOL). The method achieves lower interconnect capacitance by reducing capacitance to parasitic copper fill shapes. Parasitic capacitance is reduced physically by a) stacking copper fill shapes on each copper layer, and b) using larger dimension fill shapes. The consequence of using larger dimension fill shapes is to: a) increase white space between fill shapes, and b) reduce the summed perimeter of the fill shapes.

Stacking of fill shapes has the advantage of a voltage divider for the associated parasitic capacitance elements, while increasing white space and reducing total fill-shape perimeter reduces edge-wise coupling between fill shape elements.

Using an equivalent circuit comparison for a copper fill in interface circuit, it can be shown why stacked fill shapes are better than randomly distributed or staggered and offset fill patterns. Capacitances in parallel versus capacitances in series are shown in FIGS. 1 and 2. In these examples, a 5-layer Cu BEOL equivalent circuit is shown, neglecting fringing and perimeter (side-wise) capacitance. The separation between layers, shown as distance d, are equal for the comparison. Equivalent circuits and calculations are shown below each figure. The results shown that for the capacitances in parallel $C_{tot}=\frac{5}{6}C_1$ (FIG. 1) and for the capacitances in series $C_{tot}=\frac{1}{6}C_1$ (FIG. 2). These results show that unaligned fill, shown in FIG. 1, are five times more capacitive than perfectly aligned fill shapes, shown if FIG. 2, in terms of area capacitance alone. If side-coupling capacitance were included in the calculations, the total capacitance is even worse in the unaligned fill.

Figure 3:
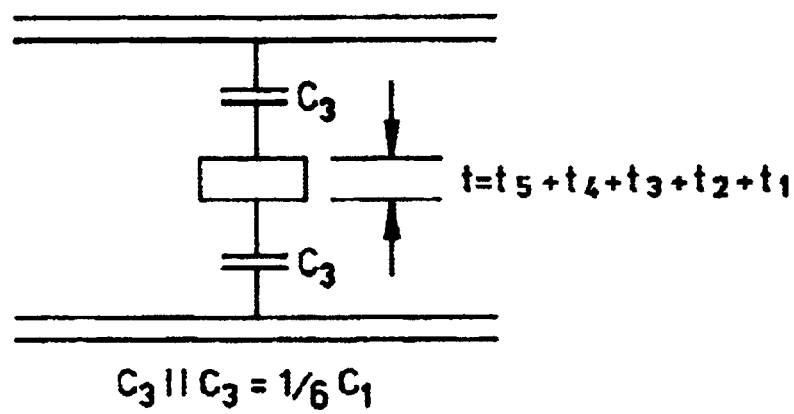
FIG. 3 is an equivalent structure to FIG. 2 having single metal conductor at the midpoint of the stack.

An equivalent structure to FIG. 2 can be modeled for the aligned fill as a single metal conductor at the midpoint of the stack, as shown in FIG. 3. Note that $C_3 \| C_3 = \frac{1}{6}C_1$ is equivalent to the 6-way parallel capacitance shown in FIG. 2. To account for fringing and side-wise coupling, the single center conductor can have a composite thickness equal to the sum of all 5 layer thickness.

Clearly, the side-wise capacitive coupling also plays an important role in metal fill capacitance in comparing fill shape sizes and their contribution to total capacitance, the area capacitance is assumed to be the same. That is to say that two comparable fill designs having equal metal fill densities, will have equal area capacitance contribution, but the side-wise coupling will vary. Larger area fill shapes produce less side-wise coupling than smaller area fill shapes when they are the predominate elements contributing to metal density. The main reasons are that 1) large area fill shapes have less perimeter, and 2) can accommodate larger distances between fill shapes. By increasing distance between fill shapes one reduces the side-wise coupling. The reduction in perimeter also reduces side-wise coupling. By increasing the fill shape size, one simultaneously meets the same density, increases the distance between fill shapes, and reduces the perimeter of the summed metal fill shapes. Thus, the larger the fill shape, the smaller the side-wise capacitance.

There are some practical limitations to the size of large size fill shapes. For example, let's assume that a 50 $\mu$m×50 $\mu$m window is used for checking metal fill density and the desired density is 20%. Then, the largest practical fill shape size would be approximately 20% of this window size. For a square fill shape in this example, this is no larger than 22.36 $\mu$m×22.36 $\mu$m (20% of the window). If the foundry can tolerate a wider window, then the fill size can grow accordingly. The present invention is not limited to square fill shape. The fill may be a circle, rectangle, octagon or other polygon shapes.

A second practical limitation for fill shape maximum size is the size of the white area that is desired. If the fill shape size substantially fills the white space, this defeats the purpose of having a white space with small capacitance effect from the metal fill. The fill shape size should act as only a small perturbation to the electric fields in the design. A rule of thumb is that the fill shape dimension should be kept to under one-tenth of the white space dimension. For example, an interface circuit having a white space dimension about 100 $\mu$m should have a fill shape about 10 $\mu$m for optimum performance.

Experiments were done to investigate the fill size effect of on-chip interconnect structures, for which the design depends on reduced capacitance in certain areas. On-chip interconnect uses a chemical mechanical polishing (CMP) process for planarizing multiple metal layers. One requirement of this CMP process is to cut holes in large metal planes and "fill" large open areas to maintain metal density within process specifications. While fill shapes arc electrically floating at DC, these fill shapes can alter transmission line impedance at high frequency due to AC coupling.

The invention was applied to on-chip white space areas in the vicinity of a flip-chip transition. The transition design depends on both the on-chip and substrate interface circuit layouts as well as the effective dielectric constant in the vicinity of the transition. Wafers were manufactured with three different fill shape designs, a first design without fill ("F"), a second design with 4-$\mu$m square fill shapes at 20% density ("F4") and a third design with 10-$\mu$m square fill shapes at 20% density ("F0"). Masks were required to pattern poly resistors, level 1 metal, passivation openings and contacts. High-lead (95% Pb:5% Sn) bumps were electroplated onto the wafers. Substrates were manufactured using 10-mil thick high-purity alumina ($Al_2O_3$). The process steps for the substrate included a) creating vias, b) filling vias with solid Au, c) depositing and etching thin film TaN/TiW/Au, d) electroplating Ni/Au, e) depositing and etching $Si_3N_4$ as a solder mask, and f) sawing to singulate. Calibration structures were also built on the substrate.

The experiment was conducted by assembling the three kinds of flip-chip bumped die onto the $Al_2O_3$ substrates, applying and curing underfill, and measuring S-parameters on a network analyzer. The flipchips were bonded to the. $Al_2O_3$ substrates by a thermo-compression bonder.

Figure 4:
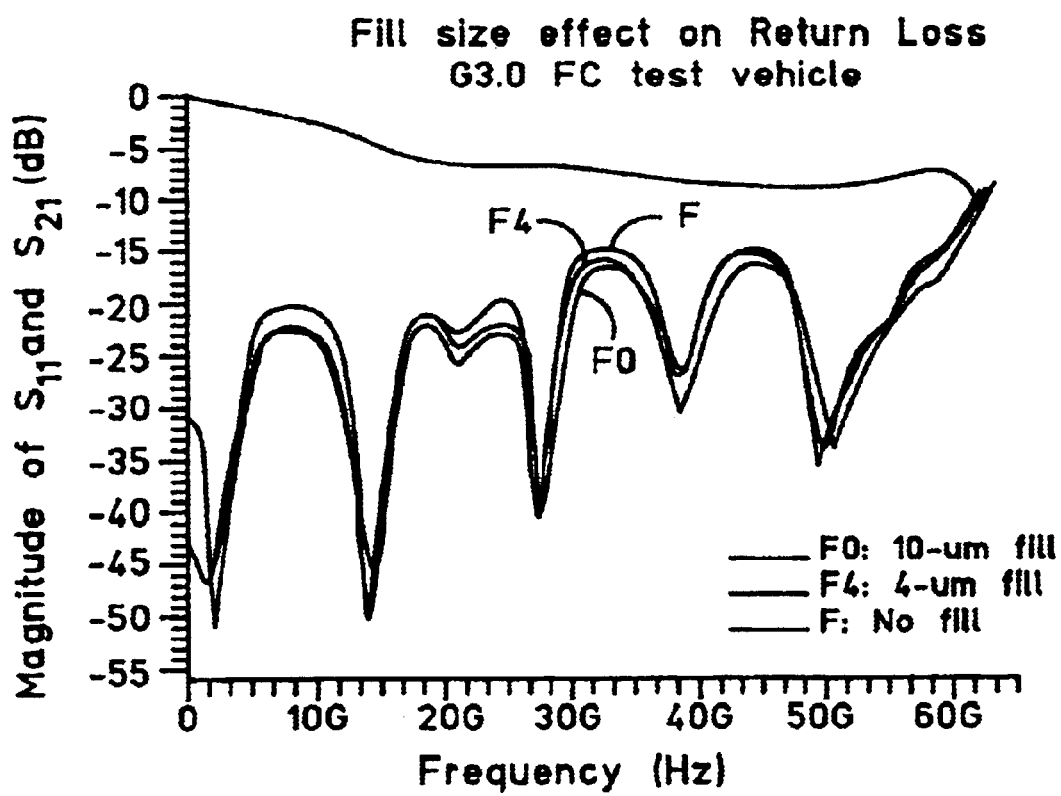
FIG. 4 is a chart showing fill size effect on return loss.

The S-parameter data for a through transmission line is shown in FIG. 4. This data represents a flip-chip transition from the substrate to the die, a 5.25 mm length of on-chip transmission line and a second flip-chip transition back to the substrate. It can be seen that the interference peaks in the return loss (S11) are dependent on the die selection. The maximum at 34 GHz peaks at −17.1 dB for F0 die, −16.4 dB for F4 die and −15.2 dB for F die. These tests validate the results that were found in the simulations, namely that the F0 die (10-$\mu$m square fill shapes) gives a better response (smaller S11) than the F4 die (4-$\mu$m square fill shapes), because of a reduced capacitance in the transition region. Both the F0 and F4 die showed lower S11 compared to the control samples, F die (no fill), because the layout was optimized for 20% fill density.

The conclusion is that floating metal shapes do have a high-frequency effect on interconnect circuit performance, due primarily to an increase in capacitive loading. The size of the fill shapes is as important as the percentage of fill in order to optimize the design. Experimental results shown above indicate that using larger size square fill shapes at 20% density yields the lowest perturbation to the transmission design and yields the greatest margin for interconnect electrical performance.

Other implementations, depending on the pitch between signal and ground, could be optimized for fill shapes as large as 25 $\mu$m to as small as a fraction of 1 micron. That is to say that the white space could be as large as 250 $\mu$m or as small as a few microns. On the minimum side, the foundry typically determines the minimum white space requiring fill, which is determined by foundry photo patterning limitations on the minimum metal linewidth. Minimum dimensions are always much smaller than those optimal for the white space requirements of this invention. The optimal utilization of this invention will be for dimensions that a) approach the maximum allowed metal feature size not requiring holes to be cut in it, and b) are still within the metal density checking window size.

Applications of this invention can be applied to any circuit topography that would otherwise use white space areas to control characteristic impedance or reduce crosstalk levels between spatially separated circuitry. Examples include high-speed on-chip interconnects between functional circuit blocks of an integrated circuit, parallel data busses, and high-speed serial interconnects, as well as flip-chip interface circuits.

The present invention has been described above with reference to a preferred embodiment. However, those skilled in the art having read this disclosure will recognize that changes and modifications may be made to the preferred embodiment without departing from the scope of the present invention. For example, the physical dimensions of a transition interface structure can vary according to scaling factors so long as the designated transmission impedance is maintained. Thus, a number of different physical layouts can function in an equivalent manner. These and other changes or modifications are intended to be included within the scope of the present invention, as expressed in the following claims.

What is claimed is:

1. A method of lowering interconnect capacitance by reducing capacitance to parasitic copper fill shapes in an integrated circuit having a plurality of copper layers formed with a copper dual-damascene back-end-of-line design, the method comprising:

forming copper fill shapes on the layers such that the copper fill shapes are stacked and aligned to form a series capacitance; and planarizing the layers with a chemical mechanical polishing process.

2. The method of claim 1, wherein the design is characterized by a minimum metal density within an arbitrary area.

3. The method of claim 2, where the minimum metal density is in the range from 10% to 50%.

4. The method of claim 2 further comprising increasing the distance between fill shapes, but maintaining a fixed metal density.

5. The method of claim 2 further comprising increasing the fill shape size, but maintaining a fixed metal density.

6. The method of claim 1, wherein the design includes white space and the fill shape dimension should be under one-tenth of the white space dimension.

7. The method of claim 1, wherein the copper fill shape is square.

8. The method of claim 1, wherein the copper fill shape is rectangular.

9. The method of claim 1, wherein the copper fill shape is octagonal.

10. The method of claim 1, wherein the copper fill shape is circular.

11. The method of claim 1, wherein the copper fill shape is a polygon.

12. The method of claim 1 further comprising reducing the perimeter of the fill shape.

* * * * *